Dec. 1, 1953 E. MITTELMANN 2,661,425

IMPEDANCE MATCHING GENERATOR

Filed May 14, 1949 2 Sheets-Sheet 1

INVENTOR.
Eugene Mittelmann
BY
Moore, Olson & Trexler
Attys.

Dec. 1, 1953 E. MITTELMANN 2,661,425

IMPEDANCE MATCHING GENERATOR

Filed May 14, 1949 2 Sheets-Sheet 2

INVENTOR.

Eugene Mittelmann

BY

Moore, Olson & Trexler

Attys.

Patented Dec. 1, 1953 2,661,425

UNITED STATES PATENT OFFICE 2,661,425

IMPEDANCE MATCHING GENERATOR

Eugene Mittelmann, Chicago, Ill., assignor to Mittelmann Electronics Corporation, Chicago, Ill., a corporation of Illinois Application May 14, 1949, Serial No. 93,328

21 Claims. (Cl. 250—36)

This invention relates to a method of and a means for matching the impedance of an oscillator to its load, and more particularly relates to electronic rematching in which the impedance of the generator is altered to conform with the changing impedance of the load in order to supply constant power to the load.

In order to secure the optimum transfer of energy from an oscillator to a load, it is desirable that the impedance of the oscillator should be matched to that of the load. In high frequency heating, the load reflected to the oscillator from the heater varies with the material placed in the heater field and also may vary during any one operation as the temperature of the material changes. Heretofore it has been common practice to vary the coupling between the oscillator and the heater in order to retain the match of impedance therebetween. There are, however, times where it is undesirable or impossible to vary the coupling between the oscillator and its load, and yet it is desirable to retain an impedance match therebetween for the optimum transfer of energy.

An important object of this invention is to produce a method of and means for varying the effective impedance of an oscillator or a generator so that it will be continually matched to a changing load.

The equivalent dynamic impedance of a vacuum tube oscillator is not a constant which is characteristic for the tube used but is a variable magnitude which is a function of the operating parameters. As a general rule, high ratios of plate voltage to plate current will correspond to high values of the equivalent generator impedance and correspondingly low values of the same ratio will indicate a low equivalent impedance.

If the load impedance changes, toward lower values, the plate current of the generator will increase, and conversely will decrease if the load impedance increases. If the equivalent generator impedance is to be changed, as contemplated by this invention to match a decreasing load impedance, it is apparent that the plate current must rise and at the same time the plate voltage must decrease in order to obtain a new and lower value of generator impedance. Conversely, to match an increasing impedance the plate current must be lowered and the plate voltage raised. In order to increase the plate current with a diminishing plate supply voltage, it is necessary to increase the grid swing, i. e., to increase the angle of plate current flow.

Further explanation of this invention will be carried out in conjunction with the accompanying drawings in which.

Figure 2:
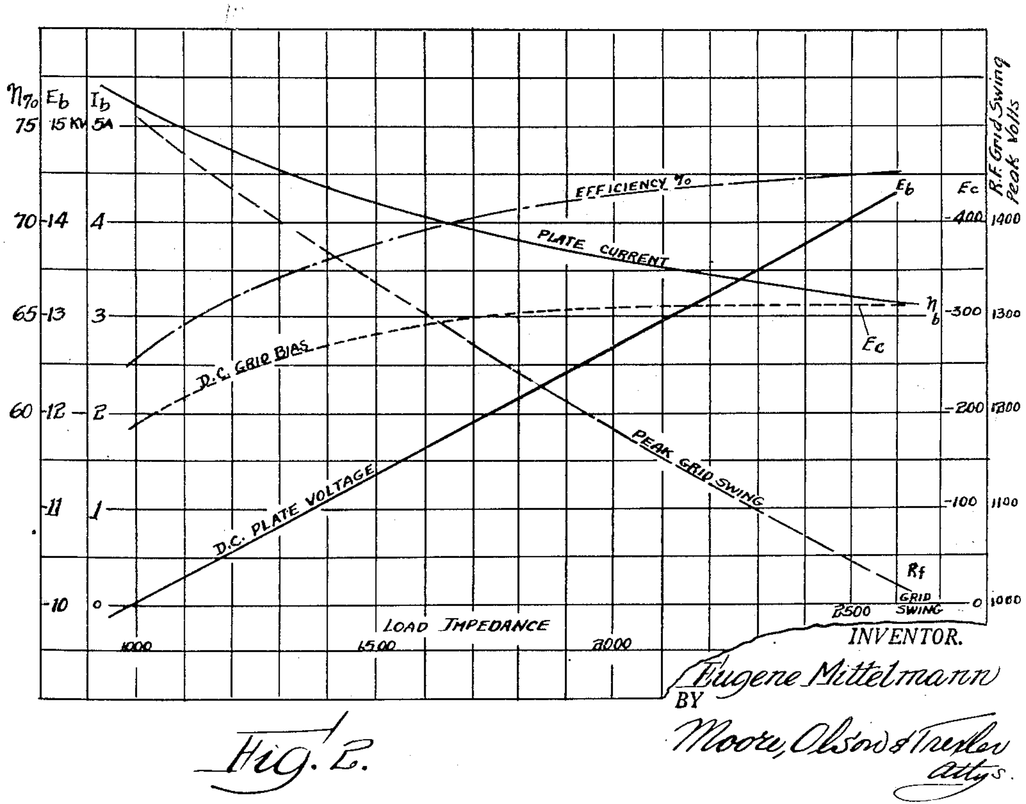
Fig. 2 shows a variety of curves representing the operating characteristics of an oscillator tube with constant power output and changing load impedance.

In order to best illustrate the phenomena involved, the operating characteristics for constant power output of an oscillator tube with a changing load impedance have been calculated and plotted in Fig. 2. The values illustrated are those for a type 498 tube and constant power output of 33 kw. From an inspection of the curves, it may be seen that the D. C. plate voltage increases with increasing impedance, the relationship between the D. C. plate voltage and load impedance being substantially linear in the region investigated. The grid swing, which is the peak value of the radio frequency grid voltage, decreases with increasing load impedance. The plate current also decreases with increasing load impedance. The D. C. grid bias increases with increasing load impedance but varies only slightly over nearly half of the region investigated. It may also be noted that the efficiency increases with increasing load impedance is the region investigated but changes only from 66% to 72.5% from 1200 ohms to 2500 ohms.

Inspection of the curves reveals that if a constant power output is to be maintained within a certain load impedance range, that peak grid voltage and D. C. plate voltage must vary inversely.

Figure 1:
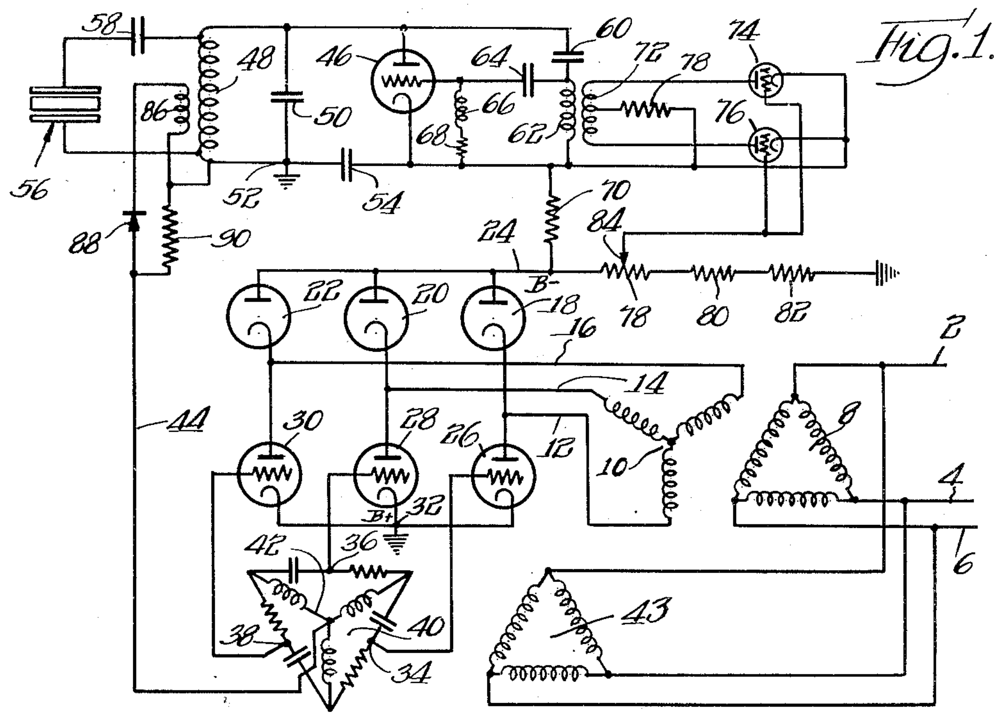
Fig. 1 is a schematic diagram of a simple circuit embodying my invention.

In Fig. 1 is shown a circuit embodying my invention which maintains constant power output by increasing the plate current at a diminishing plate voltage by increasing the grid swing, i. e., by increasing the angle of plate current flow.

The oscillator is shown as being supplied with power from three supply lines 2, 4 and 6 connected to a power transformer, the primary 8 of which is delta connected. It is contemplated, however, that a single phase supply source could be used. The secondary 10 is Y connected with the legs of the transformer connected to wires 12, 14, 16, the wires supplying a three-phase full wave rectifier. The rectifier includes three diodes 18, 20 and 22, which may be of the gas filled type and have their anodes connected in parallel to a B— supply line 24. The cathodes are connected respectively to the anodes of grid controlled tubes 26, 28 and 30 which are preferably gas filled, and are also connected to the wires 12, 14 and 16 leading from the secondary of the power transformer. The cathodes of these three triodes are connected in parallel to provide a B+ potential which is preferably grounded as at 32 to preclude the possibility of a high D. C. voltage appearing on the heater. The grids of the triodes are connected to symmetrically disposed points 34, 36 and 38 of a phase shifting network 40 which includes the Y connected secondary 42, the delta connected primary 43 of which is connected to the supply lines 2, 4 and 6. The phase relation between the grids and plates is thus predetermined to help control the firing time of the triode. The midpoint of the Y connected secondary 42 is connected to a wire 44, the purpose of which will be explained in detail later.

The oscillator itself includes an electron tube 46 which is illustrated as a triode having its plate connected to a tuned plate circuit including an inductance 48 and capacitance 50 connected in parallel. The end of the tuned circuit opposite the plate is connected to ground as at 52 to supply B+ voltage. The grounded end of the plate tank circuit is also connected to the cathode of the oscillator tube 46 by a condenser 54. A reactive heater 56, which may be a dielectric or an induction heater, is supplied with power from the oscillator tank circuit by direct coupling including a capacitor 58.

The feed back circuit of the oscillator includes a capacitor 60 and an inductance 62, connected between the plate and cathode, the junction point between them being coupled by a capacitor 64 to the grid of the tube 46. The grid is also connected to the cathode by an inductance 66 and a resistor 68 connected in series. The cathode is connected to the B— supply line 24 through a resistor 70 to complete the D. C. plate circuit. The feed back inductance 62 comprises the primary of a transformer having a center tapped secondary 72. The ends of the secondary are connected to the plates of a pair of triode electron tubes 74 and 76, the cathodes of which are connected in parallel to the cathode of the oscillator tube 46. The plate circuits of the tubes 74 and 76 are completed through a current limiting resistor 78 connected between the center tap of the secondary 72 and the cathodes. To the B— supply line is connected a potentiometer 78 which is in turn connected to series resistors 80 and 82, the latter of which is grounded. The grids of the tubes 74 and 76 are parallel connected to the tap 84 on the potentiometer 78 to supply D. C. grid bias.

To the grounded end of the plate tank circuit is connected an inductance 86 which is inductively coupled to the inductance 48. The other end of the inductance 86 is connected to a rectifier 88 and the return circuit from the rectifier is completed by a resistor 90. The junction between the rectifier 88 and resistor 90 is connected to the previously mentioned wire 44 and thence indirectly to the grids of the grid controlled rectifier in the power supply.

It is apparent that for any given value of capacity 60 the feed back voltage is determined by the magnitude of the inductance 62. As the inductance 62 is inductively coupled to the secondary 72, its magnitude will be in large measure determined by the current carried by the secondary 72, having a maximum value when the current in the secondary is at a minimum, and a minimum value when the current is at a maximum.

For purposes of explanation, it will be assumed that the oscillator or generator has been operating under matched conditions and the load impedance decreases due to a change in object or in dielectric as the temperature of the heated object rises. This causes the plate current to rise. The increased plate current causes an additional voltage drop across the resistor 70 connected to the B— supply. The increased voltage drop across the resistor 70 applies an increased negative bias to the grids of the tubes 74 and 76, reducing the current through the secondary 72, and as a result increasing the effective inductance of the inductance 62. The feed back voltage to the tube 46 is thus increased, yielding an increased angle of flow of the plate current. To reduce the generator impedance to match the new load impedance while maintaining the power output constant, it is necessary to reduce the plate supply voltage along with the increasing plate current as a function of the increased grid swing. In the oscillator shown, the grid swing is directly proportional to the R. F. tank voltage, and as a consequence, a voltage derived from the tank inductance 48 will be proportional to the voltage across the inductance 62. Such a voltage is derived from the tank inductance 48 by the inductance 86 coupled to it and is rectified by the rectifier 88 to develop a voltage across the resistor 90 which is injected with a negative polarity by means of the wire 44 and the phase shifter 40 to the grids of the grid control rectifier tube 26, 28 and 30. Due to the decreased grid bias, these tubes now fire a lesser amount and the plate voltage is reduced to conform to the requirement illustrated in Fig. 2.

When the plate voltage decreases, voltage across the tapped off portion of the potentiometer 78 becomes less positive, decreasing the current through the tubes 74 and 76. The consequent decreased current through the secondary 72 thus raises the effective inductance of the inductance 62 and compensates for a tendency toward plate current reduction due to decreased plate voltage.

Figure 3:
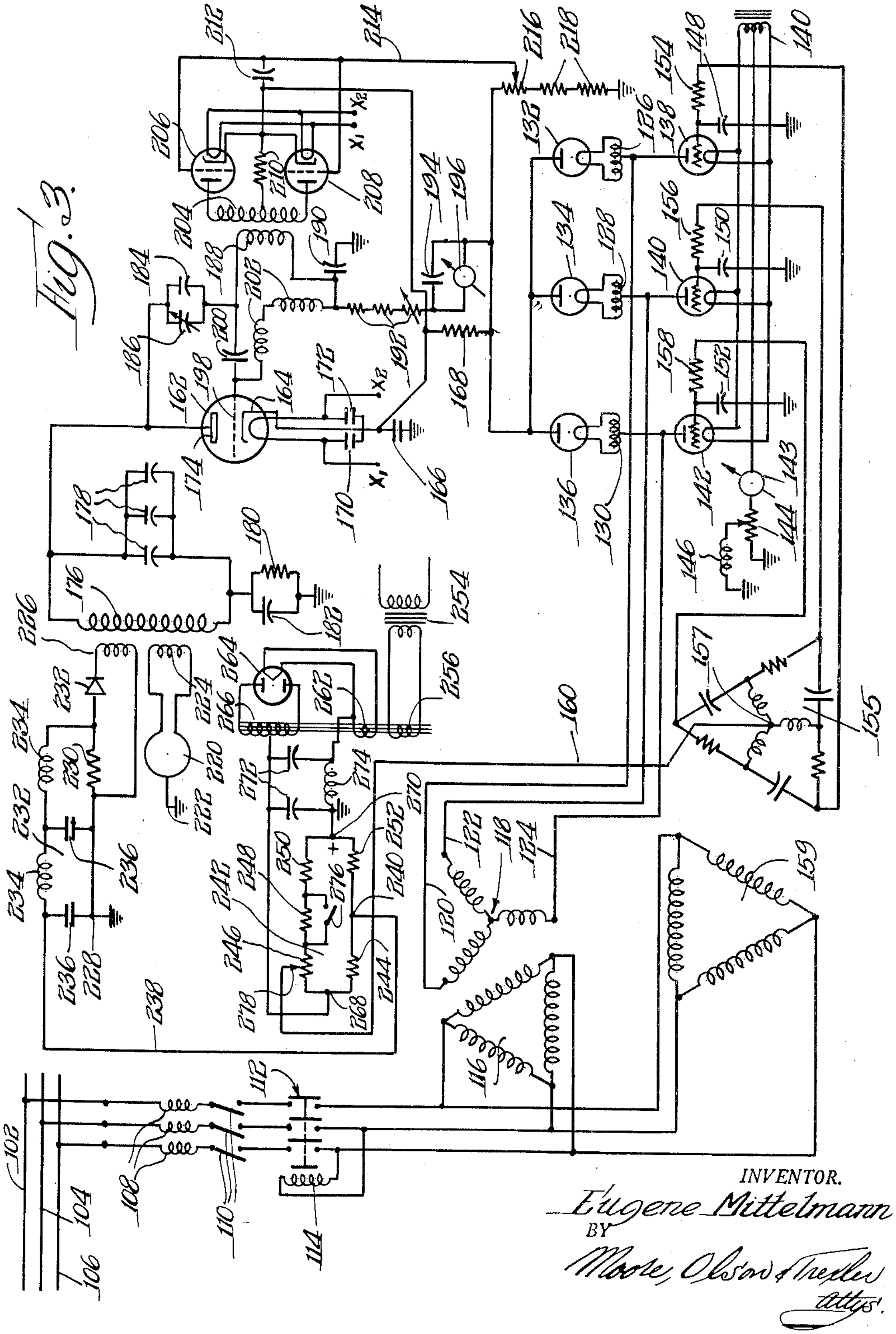
Fig. 3 is a schematic diagram of a further embodiment of the present invention.

In Fig. 3 is shown another embodiment of the current invention, this embodiment being one such as might be used in a commercial application. Power is supplied through a three-phase supply line having the wires 102, 104 and 106. To these wires are connected the series coils 108 of an overload circuit breaker having movable switch arms 110. On the load side of the breakers is a push button switch 112 having a holding coil 114 connected on the load side of the push button switch. The push button switch 112 is preferably of the type having two buttons, one of which is pushed to make the connection which by virtue of the holding coil remains made until the other push button is pushed to break the connection. Wires lead from the push button switch to the delta connected primary 116 of a power transformer, the Y connected secondary 118 having its legs connected to wires 120, 122 and 124. These wires are in turn connected to the center taps of the secondaries 126, 128 and 130 of filament transformers, the primaries of which are not shown. The ends of these secondaries are connected to the heater-cathodes of diode rectifier tubes 132, 134 and 136 which are preferably of the gas filled type. The wires 120, 122 and 124 are also connected to the anodes of grid controlled rectifier tubes 138, 140 and 142 which are also preferably the gas filled type. The heater-cathodes of the grid controlled rectifiers are connected in parallel to the secondary 140 of a filament transformer, the primary of which is not shown. A center tap of the secondary 140 is connected through an ammeter 143 and a resistor 144 to ground, thus providing a grounded B+ voltage supply. A tap on the resistor 144 leads to the actuating coil of an overload relay 146, the other end of which is grounded. The grids of the controlled rectifier tubes 138, 140 and 142 are grounded through capacitors 148, 150 and 152 and are connected through resistors 154, 156 and 158 to symmetrically disposed points on a three-phase shifting network 155 including the Y connected secondary 157 of a transformer, the delta connected primary 159 of which is connected in parallel with the primary 116 of the power transformer. The center point of the Y connected secondary 155 is connected to a wire 160.

The generator comprises an oscillator tube 162 which may have a cathode 164 connected through a capacitor 166 to ground and also connected through a resistor 168 to the B— supply of the rectifier. The filament leads of the oscillator tube 162 are respectively connected to a filament transformer, the connections being indicated as X–1 and X–2. The filament leads are also connected through capacitors 170 and 172 to the cathode 164 and to ground. The plate 174 of the oscillator tube is connected to a tuned circuit comprising an inductance 176 with three parallel capacitors 178 connected in parallel thereto. A single capacitor could of course be used rather than the three shown here, but it is preferable to use a plurality of standard capacitors rather than requiring one of non-standard construction. It will be noted later that other circuit elements are arranged in plural numbers for a like reason and also for more efficient heat dissipation. The opposite end of the tuned circuit is connected through a current limiting resistor 180, paralleled by a capacitor 182, to ground to complete the B+ supply for the oscillator plate circuit.

A feed back circuit for the oscillator tube 162 includes a pair of capacitors 184 and 186, the latter being tunable, connected in parallel to the plate 174 and an inductance 188 which is the primary of a transformer. The other end of the inductance 188 is connected through a capacitor 190 to ground and through a plurality of resistors 192, one of which is variable in series with a parallel combination of a capacitor 194 and an ammeter 196 to the B— supply from the rectifier. The junction between the capacitors 184 and 186 and the inductance 188 is connected to the control grid 198 of the oscillator tube by a coupling capacitor 200. The control grid is also connected through series inductances 202 to the junction between the inductance 188 and resistors 192 to provide D. C. grid bias and current for the oscillator tube 162. To the inductance 188 is coupled an inductance 204 which is the center tapped secondary of the transformer having 188 for a primary. The ends of the secondary 204 are connected to the plates of a pair of electronic tubes 206 and 208 which for illustrative purposes are shown as being triodes. The center tap of the secondary 204 is connected through a resistor 210 to the cathodes of the tubes 206 and 208 to complete the plate circuit and also to the cathode of the oscillator tube 174. The cathodes of the tubes 206 and 208 to complete the plate circuit and also to the cathode of the oscillator tube 174. The cathodes of the tubes 206 and 208 are also connected through a capacitor 212 to a wire 214 to which the grids of the tubes 206 and 208 are also connected in parallel. The wire 214 provides D. C. bias for the grids from a voltage divider comprising a tapped potentiometer 216 and a plurality of resistors 218 connected between the B— supply and ground.

A heater 220 is shown diagrammatically as it may be of any desirable type. The heater is grounded as at 222 and is coupled as by an inductance 224 to the tuned circuit inductance 176 in the plate circuit of the oscillator tube 162 to receive high frequency power therefrom.

A rectifier grid controlling circuit is coupled to the inductance 176 by an inductance 226 grounded at one end as at 228 and having a resistor 230 and rectifier 232 connected in series with it. The voltage developed across the resistor 230 is applied with negative polarity to a filter 232 comprising inductances 234 and capacitors 236. From this filter the potential is carried by a wire 238 to a junction point 240 of a network 242 including resistors 244, 246, 248, 250 and 252 in a closed series circuit. A step down transformer 254 provides 110 volts from a pair of the three-phase supply lines 102, 104 and 106 so that an ordinary 110 volt input power transformer may be used for a purpose to be described. The primary 256 of such a 110 volt transformer may be connected directly to the secondary of the transformer 254. A filament winding 262 is connected to the heater cathode of a full wave rectifier tube 264, the plates of which are connected to the extremities of a secondary coil 266. A center tap on the winding is connected to a junction point 268 to provide negative potential to one end of the network 242. The filament winding 262 is connected to another junction point 270 at the opposite end of the network 242 to provide positive potential at that point, a filter comprising capacitors 272 and inductance 274 being connected across the rectified voltage supplied to eliminate ripple. The resistor 248 of the network 242 is paralleled by the switch 276 of the overload relay 146, and a movable tap 278 on the resistor 246 is connected to the previously mentioned wire 160 and from thence through the phase shifting network 155 and grid resistors 154, 156 and 158 to the grids of the controlled rectifier tubes 138, 140 and 142.

When an article to be heated is placed in the reactive heater 220, the push button switch 212 may be actuated by pushing its associated push button. The holding coil 114 is then energized to keep the switch 112 closed until such time as it is manually opened by an associated push button. As the switch 112 is closed power is supplied to all of the power supply transformers in the apparatus and as soon as the filaments have heated up the generator including the oscillator tube 162 begins to oscillate to supply power to the heater. Assuming the generator and load to have been matched, the impedance match between the load and generator will change as the article being heated changes with temperature or there will be an initial mismatch if the load inserted was not of the same impedance as the last previous load. If the load impedance decreases the plate current will increase suddenly, thus increasing the voltage drop across the resistor 168 connected in the oscillator cathode circuit. As the potential across the resistor 168 increases it provides an increased negative bias for the grids of the control tubes 206 and 208, thus decreasing the current carried by these tubes and by the secondary 204. As was explained with regard to the inductances 62 and 72 in Fig. 1, the decreased current in the secondary increases the effective inductance of the primary, in this case 188, thus increasing the feed back voltage to the oscillator tube 162 yielding an increased angle of flow of the plate current. The plate current is thus increased beyond its original value. To decrease the equivalent generator impedance it is necessary at the same time to reduce the plate supply voltage as a function of the increased grid swing. The voltage induced in the inductance 226 is proportional to that in the inductance 176 of the oscillator plate tank circuit and is hence proportional to the grid swing. The alternating current voltage so induced is rectified by the rectifier 232 to produce a direct current voltage across the resistor 230, this last voltage being applied with negative polarity to the junction point 240 of the network 242 by means of the filter circuit 232 and the wire 238.

The grids of the controlled rectifier tubes 138, 140 and 142 are maintained a predetermined angle out of phase with the plates by the phase shifter 155 which is coupled by means of the transformer secondary and primary 157 and 159 to the same power supply source as the power transformer primary and secondary 116 and 118, to control the amount of current passed by these rectifier tubes. Further control is had by means of the adjustable tap 278 on the network 242 which determines the grid bias of the controlled rectifier tubes. The voltage picked off by the tap 178 is made more negative by the negative voltage applied at 240 due to the decreased load impedance and this reduces the grid voltage of the controlled rectifier tubes 138, 140 and 142 to reduce the rectified voltage, thus decreasing the equivalent generator impedance to match that of the load.

As the rectified plate voltage decreases, a lesser potential appears across the voltage divider comprising the potentiometer 216 and resistor 218 and consequently the voltage tapped off across the potentiometer 216 becomes less positive, thus decreasing the current through the tubes 206 and 208 and consequently the current through the secondary 204. Accordingly, the effective inductance of the inductance 188 is raised to increase the feed back voltage and compensate for the tendency toward a plate current reduction due to the reduction of plate voltage.

If the plate current becomes too high at any time the cathode current of the rectifier will be increased sufficiently to cause the overload relay coil 146 to actuate its associated switch 276 to lower the potential applied to the grids of the controlled rectifier tube 138, 140 and 142 and thus cause these tubes to fire at a later time in each cycle and consequently reduce the plate current to a safe level. This plate current may at all times be read on the ammeter 142 and in like manner the grid current of the oscillator tube 162, which is controllable by the variability of one of the resistors 192, may be read on the ammeter 196. Other safety devices which may be incorporated include the current limiting resistor 210.

Although for purposes of illustration I have shown and described certain preferred embodiments of my invention, I do not intend to be limited thereby but only by the spirit and scope of the appended claims.

The invention is hereby claimed as follows:

1. The method of varying the impedance of a high frequency generator having plate current and output voltage parameters to match a varying impedance load which comprises varying both the plate current and direct current plate supply voltage of the generator relatively inversely in response to change in one of said parameters.

2. The method of varying the impedance of a high frequency electronic tube generator having plate current and output voltage parameters to match a varying impedance load while maintaining a constant power input to the load which comprises varying the direct current plate supply voltage of the generator positively relative to the variation in load impedance, varying the generator plate current inversely relative to the change in load impedance and varying the angle of plate current flow of the electronic tube inversely relative to the varying impedance, the generator variations being controlled by a change in said parameters.

3. The method of varying the impedance of a high frequency electronic tube generator to match a varying impedance load while maintaining a constant power input to the load which comprises deriving an oscillator feedback voltage varying inversely with the impedance of the load, utilizing said voltage to vary the angle of plate current flow of the electronic tube inversely relative to the load impedance, deriving a voltage proportional to the feedback voltage, and utilizing this last named voltage to vary the direct current plate supply voltage in accordance with the change in load impedance.

4. In a high frequency generator supplying constant power to a heater, means for continuously varying the impedance of the generator to match a varying load impedance comprising an oscillator having output and input circuits with plate current and output voltage parameters, means for varying both the oscillator direct current plate supply voltage and plate current relatively inversely, said last named means including means for varying the angle of plate current flow in response to a change in said parameters.

5. In a high frequency oscillator having output and input circuits with plate current and output voltage parameters, means for supplying constant power to a variable load, said means including a high frequency feedback circuit having a plurality of reactance elements, and means for changing the value of at least one of said reactance elements to change the feedback ratio in response to change in one of said parameters.

6. In a high frequency generator supplying power to a heater, means for continuously varying the impedance of the generator to match a varying load impedance comprising an oscillator having output and input circuits with plate current and output voltage parameters, means for varying the oscillator plate current inversely relative to the changing load impedance, means for varying the oscillator direct current plate supply voltage positively relative to said changing load impedance, said last two means including means responsive to a change in said parameters.

7. In a high frequency generator supplying power to a heater, means for continuously varying the impedance of the generator to match a varying load impedance comprising an oscillator, means for deriving a high frequency oscillator feedback voltage the magnitude of which varies inversely with the changing load impedance, means for varying the plate current in accordance with said feedback voltage, and means for varying the oscillator direct current plate supply voltage inversely relatively to said feedback voltage.

8. Impedance matching means as defined in claim 7 in which the means for varying the oscillator direct current plate supply voltage inversely relative to the feedback voltage includes means for deriving a control voltage proportional to the feedback voltage, and means for utilizing said control voltage to vary said direct current plate supply voltage inversely relatively to said feedback voltage and directly relative to said changing impedance.

9. In a high frequency generator, means for supplying constant power to a variable impedance load, said means comprising an oscillator having input and output circuits with plate current and output voltage parameters, a feedback circuit for said oscillator, energy absorption means in said feedback circuit and means responsive to change in one of said parameters to vary the energy absorbed from said feedback circuit whereby to vary the feedback voltage.

10. In a high frequency generator supplying power to a heater, means for continuously varying the impedance of the generator to match a varying load impedance comprising an oscillator, means for concurrently varying the oscillator plate voltage and plate current relatively inversely, said means including a high frequency oscillator feedback circuit, a variable reactive element in said feedback circuit, and means for varying the reactance of said reactive element inversely relative to said changing load impedance.

11. Impedance matching apparatus as defined in claim 10 in which the variable reactive element is a variable inductance.

12. In a high frequency generator supplying power to a heater, means for continuously matching the generator to a varying load impedance comprising an oscillator, means for varying the plate voltage of said oscillator in accordance with changes in the load impedance, a feedback circuit for said oscillator, said feedback circuit including a variable inductance, said inductance being the primary of a transformer, and means for varying the current in the secondary of said transformer directly relative to said load impedance, whereby to vary the plate current of said oscillator, inversely relative to said changing load impedance.

13. An impedance matching device as recited in claim 12 in which the means for varying the current in the secondary of the transformer includes the plate resistance of an electron tube in circuit with said transformer, and means for varying the plate resistance of said tube inversely in accordance with the changing load impedance.

14. In a high frequency generator supplying power to a heater, means for continuously matching the generator to a varying load impedance comprising an oscillator, means for varying the plate voltage in accordance with a change in load impedance, a transformer, a feedback circuit for said oscillator, said feedback circuit including an inductance which is the primary of said transformer, an electron tube having its plate circuit in series with the secondary of said transformer, means for deriving a potential varying inversely relative to said load impedance and means for controlling the plate resistance of said electron tube by said last named potential.

15. In a high frequency generator supplying power to a heater, means for continuously matching the generator to a varying load impedance while supplying constant power thereto comprising an oscillator, means for deriving a high frequency feedback voltage varying inversely relative to said load impedance, a feedback circuit for said oscillator, power supply means for said oscillator, and means varying the voltage output of said power supply inversely relative to said feedback voltage.

16. Impedance matching apparatus as recited in claim 15 in which the means for deriving a potential proportional to said feedback voltage comprises a closed circuit including a unilaterally conducting device and a resistive element across which to develop a direct current potential to control the operation of said power supply means.

17. In a high frequency generator supplying power to a heater, means for continuously matching the generator to a varying load impedance comprising an oscillator, a high frequency feedback circuit for said oscillator, said feedback circuit including a variable reactive element, means for varying the reactance of said reactive element inversely relative to the change in load impedance, power supply means for said oscillator, said power supply means including an electronic tube having a control element, means for deriving a potential proportional to said feedback voltage and means for applying said potential to the control element of said electronic tube to control the voltage output of said power supply means.

18. Impedance matching apparatus as set forth in claim 17 wherein the means for applying the potential for the control element of the electronic tube includes a phase shifting network.

19. In a high frequency generator supplying power to a heater, means for continuously matching the generator to a varying load impedance comprising an oscillator, means for varying the plate voltage in accordance with a change in load impedance, a transformer, a feedback circuit for said oscillator, said feedback circuit including an inductance which is the primary of said transformer, an electron tube having its plate circuit in series with the secondary of said transformer, means for deriving a potential varying in accordance with the variation in plate voltage, and means for varying the plate resistance of said electron tube in proportion to said plate voltage.

20. In a high frequency generator supplying power to a heater, means for continuously matching the generator to a varying load impedance comprising an oscillator having plate current and output voltage parameters, means for varying the oscillator plate current inversely relative to the changing load impedance, power supply means for said oscillator providing a direct current plate potential, means for developing a voltage proportional to the oscillation voltage of said oscillator, and means for varying the output of said power supply in accordance with said last named voltage.

21. In a high frequency generator supplying power to a heater, means for continuously matching the generator to a varying load impedance comprising an oscillator, a high frequency feedback circuit for said oscillator, power supply means for said oscillator including an electron discharge device having a control element, means for deriving a potential proportional to the voltage of said feedback circuit, and means for applying said potential to the control element of said electron discharge device to control the voltage output of said power supply means.

EUGENE MITTELMANN.

References Cited in the file of this patent

UNITED STATES PATENTS

| Number | Name | Date |
|---|---|---|
| 2,138,138 | Bruckner | Nov. 29, 1938 |
| 2,175,694 | Jones, Jr. | Oct. 10, 1939 |
| 2,467,285 | Young et al. | Apr. 12, 1949 |
| 2,470,443 | Mittelmann | May 17, 1949 |

FOREIGN PATENTS

| Number | Country | Date |
|---|---|---|
| 425,308 | Great Britain | Mar. 7, 1935 |
| 439,166 | Great Britain | Dec. 2, 1935 |